US010886069B2

(12) United States Patent
Maekawa et al.

(10) Patent No.: US 10,886,069 B2
(45) Date of Patent: Jan. 5, 2021

(54) MULTILAYER CERAMIC ELECTRONIC DEVICE AND CIRCUIT BOARD HAVING SAME

(71) Applicant: TAIYO YUDEN CO., LTD., Tokyo (JP)

(72) Inventors: Kazuya Maekawa, Tokyo (JP); Koji Kawase, Gunma (JP); Takahiro Ishii, Gunma (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 16/834,272

(22) Filed: Mar. 30, 2020

(65) Prior Publication Data

US 2020/0328028 A1   Oct. 15, 2020

(30) Foreign Application Priority Data

Apr. 10, 2019 (JP) .................................. 2019-074735

(51) Int. Cl.
| | |
|---|---|
| *H01G 4/30* | (2006.01) |
| *H01G 4/248* | (2006.01) |
| *H01G 4/008* | (2006.01) |
| *H05K 1/18* | (2006.01) |

(52) U.S. Cl.
CPC ............... *H01G 4/30* (2013.01); *H01G 4/008* (2013.01); *H01G 4/248* (2013.01); *H05K 1/181* (2013.01); *H05K 2201/10015* (2013.01)

(58) Field of Classification Search
CPC .......... H01G 4/30; H01G 4/008; H01G 4/248; H01G 4/33; H05K 1/181
See application file for complete search history.

(56) References Cited

U.S. PATENT DOCUMENTS

| | | | |
|---|---|---|---|
| 10,117,333 B2 * | 10/2018 | Teraoka ................. | H05K 1/181 |
| 2015/0083475 A1 * | 3/2015 | Kim ........................ | H01G 2/06 |
| | | | 174/260 |
| 2020/0035417 A1 * | 1/2020 | Sakurai ................... | H01G 4/30 |

FOREIGN PATENT DOCUMENTS

JP       2004-186602 A       7/2004

* cited by examiner

*Primary Examiner* — Timothy J Thompson
*Assistant Examiner* — Amol H Patel
(74) *Attorney, Agent, or Firm* — Chen Yoshimura LLP

(57) ABSTRACT

A multilayer ceramic electronic device includes a pair of external electrodes respectively covering end surfaces of a main body, wherein a height of the multilayer ceramic electronic device that includes the pair of eternal electrodes is greater than 0.80 times and less than 1.25 times as much as the lessor of a width dimension of the electronic device and a length dimension of the electronic device, and wherein each of the pair of external electrodes includes a tin plating film as an outermost layer, and a thickness of the tin plating film on the end surface of the main body is smaller than a thickness of the tin plating film on side surfaces of the main body.

24 Claims, 11 Drawing Sheets

MULTILAYER CERAMIC ELECTRONIC DEVICE AND CIRCUIT BOARD HAVING SAME

BACKGROUND OF THE INVENTION

Technical Field

The present invention relates to a multilayer ceramic electronic device and a circuit board having the same.

Background Art

In multilayer ceramic electronic devices, such as multilayer ceramic capacitors, typically, an undercoat electrode is formed by pasting a conductive paste on a ceramic main body, and a plurality of plating films are formed on the undercoat electrode so as to form an external electrode. Generally, such a multilayer ceramic electronic device is mounted on a printed circuit board by soldering the external electrodes in a reflow method.

For example, Patent Document 1 discloses an electronic part having an electronic part main body and external electrodes having prescribed structures that are engineered in view of improving self-alignment ability when mounting the device by the reflow method and preventing one of the external electrodes from rising upwardly during soldering.

RELATED ART DOCUMENT

Patent Document

Patent Document 1: Japanese Patent Application Laid-Open Publication No. 2004-186602

SUMMARY OF THE INVENTION

The reactivity, thermal conductivity, and the thermal capacity of plating films change depending on the thickness of the plating films, thereby affecting the wettability of the solder. Because of this, in the technology disclosed in Patent Document 1, as described above, when electronic parts are miniaturized further, one of the external electrodes rises upwardly during soldering due to a slight thickness difference in the plating films, and therefore, it was difficult to improve the connection reliability between the external electrodes and the substrate that mounts the electronic part.

In view of the foregoing, an object of the present disclosure is to provide a multilayer electronic device having a high connection reliability for the external electrodes and a circuit board mounting such a multilayer electronic device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a multilayer ceramic electronic device, comprising: a ceramic main body having generally a rectangular parallelepiped shape having top and bottom surfaces opposite to each other, right and left side surfaces opposite to each other in a widthwise direction, and end surfaces opposite to each other in a lengthwise direction, the ceramic main body including a plurality of internal electrodes laminated vertically with dielectric ceramic layers interposed therebetween, a pair of external electrodes respectively covering the end surfaces of the main body, each of the pair of external electrodes being in contact with lateral ends of one or more of the plurality of electrodes that are exposed from one of the end surfaces, each of the pair of external electrodes extending beyond peripheral edges of the corresponding end surface so as to cover portions of the top and bottom surfaces and portions of the side surfaces that are adjacent to and abut the corresponding end surface, each of the pair of external electrodes having an undercoat film disposed on the ceramic main body and a plating film on the undercoat film, wherein a height of the multilayer ceramic electronic device that includes the pair of eternal electrodes is greater than 0.80 times and less than 1.25 times as much as the lessor of a width dimension of the multilayer ceramic electronic device, as measured in the widthwise direction, and a length dimension of the multilayer ceramic electronic device, as measured in the lengthwise direction, and wherein in each of the pair of external electrodes, the plating film includes a tin plating film as an outermost layer, and a thickness of the tin plating film on the end surface is smaller than a thickness of the tin plating film on the side surfaces.

With this structure, because the thickness of the tin plating film on the end surface is smaller than the thickness of the tin plating film on the side surfaces, the reactivity between the solder and the tin plating film on the side surfaces improves, and the solder rises along the tin plating film on the side surfaces earlier than on the end surface due to wetting. This can prevent an undesired phenomena of the solder rising along the tin plating layers on the end surface at one side of the device more than on the end surface at the other side, which would cause the tin plating layer on the end surface at the other side of the device to rise higher over the mounting substrate. As a result, each of the pair of external electrodes can be mounted on the mounting substrate securely, enhancing the connection reliability.

In the above-described multilayer ceramic electronic device, the thickness of the tin plating film on the end surface may be 0.90 to 0.97 times as much as the thickness of the tin plating film on the side surface.

With this configuration, the above-described undesired phenomena of the solder rising along the tin plating layers on the end surface at one side of the device more than on the end surface at the other side can be more securely prevented. Further, upon mounting, the solder will rise on the tin plating layer on the end surfaces on both sides in an appropriate amount, preventing unbalanced application of the solder and improving the connection reliability of the external electrodes.

In the above-described multilayer ceramic electronic device, in each of the pair of external electrodes, the plating film may further include a nickel plating film interposed between the undercoat film and the tin plating film, and a thickness of the nickel plating film on the end surface may be greater than a thickness of the nickel plating film on the side surfaces.

With this configuration, sufficient amounts of thermal conductivity and thermal capacity are provided on the plating layers on the end surfaces on both sides, improving the solder wettability on the plating layers on the end surfaces. This can further improve the connection reliability of the external electrodes.

The thickness of the nickel plating film on the end surface may be greater than 1.00 times and less than or equal to 1.10 times as much as the thickness of the nickel plating film on the side surfaces.

In the above-described multilayer ceramic electronic device, in each of the pair of external electrodes, the plating film may further include a copper plating film interposed between the undercoat film and the tin plating film, and a thickness of the copper plating film on the end surface may be greater than a thickness of the copper plating film on the side surfaces.

With this configuration, sufficient amounts of thermal conductivity and thermal capacity are provided on the plating layers on the end surfaces on both sides, improving solder wetting properties on the plating layers on the end surfaces. This can further improve the connection reliability of the external electrodes.

The thickness of the copper plating film on the end surface may be greater than 1.00 times and less than or equal to 1.20 times as much as the thickness of the copper plating film on the side surfaces.

In the above-described multilayer ceramic electronic device, the height of the multilayer ceramic electronic device that includes the pair of eternal electrodes may be less than or equal to 0.4 mm, and the greater of the width dimension of the multilayer ceramic electronic device and the length dimension of the multilayer ceramic electronic device may be less than or equal to 0.2 mm.

In another aspect, the present disclosure provides a circuit board, comprising: a mounting substrate; and a multilayer ceramic electronic device mounted on the mounting substrate by soldering; the multilayer ceramic electronic device, including: a ceramic main body having generally a rectangular parallelepiped shape having top and bottom surfaces opposite to each other, right and left side surfaces opposite to each other in a widthwise direction, and end surfaces opposite to each other in a lengthwise direction, the ceramic main body including a plurality of internal electrodes laminated vertically with dielectric ceramic layers interposed therebetween, a pair of external electrodes respectively covering the end surfaces of the main body, each of the pair of external electrodes being in contact with lateral ends of one or more of the plurality of electrodes that are exposed from one of the end surfaces, each of the pair of external electrodes extending beyond peripheral edges of the corresponding end surface so as to cover portions of the top and bottom surfaces and portions of the side surfaces that are adjacent to and abut the corresponding end surface, each of the pair of external electrodes having an undercoat film disposed on the ceramic main body and a plating film on the undercoat film, wherein a height of the multilayer ceramic electronic device that includes the pair of eternal electrodes is greater than 0.80 times and less than 1.25 times as much as the lessor of a width dimension of the multilayer ceramic electronic device, as measured in the widthwise direction, and a length dimension of the multilayer ceramic electronic device, as measured in the lengthwise direction, wherein in each of the pair of external electrodes, the plating film includes a tin plating film as an outermost layer, and a thickness of the tin plating film on the end surface is smaller than a thickness of the tin plating film on the side surfaces, and wherein with respect to each of the pair of external electrodes, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

As described above, the present disclosure provides a multilayer ceramic electronic device and a circuit board mounting such a device that are capable of improving the connection reliability of the external electrodes.

It is to be understood that both the foregoing general description and the following detailed description are exemplary and explanatory, and are intended to provide further explanation of the invention as claimed.

BRIEF DESCRIPTION OF THE DRAWINGS

FIG. 7A is a perspective view of main parts of the multilayer ceramic capacitor that is to be measured. FIG. 7B is a plan view showing the measurement plane. FIG. 7C is a top view of main parts of the external electrode that is to be measured.

DETAILED DESCRIPTION OF EMBODIMENTS

Figure 1:
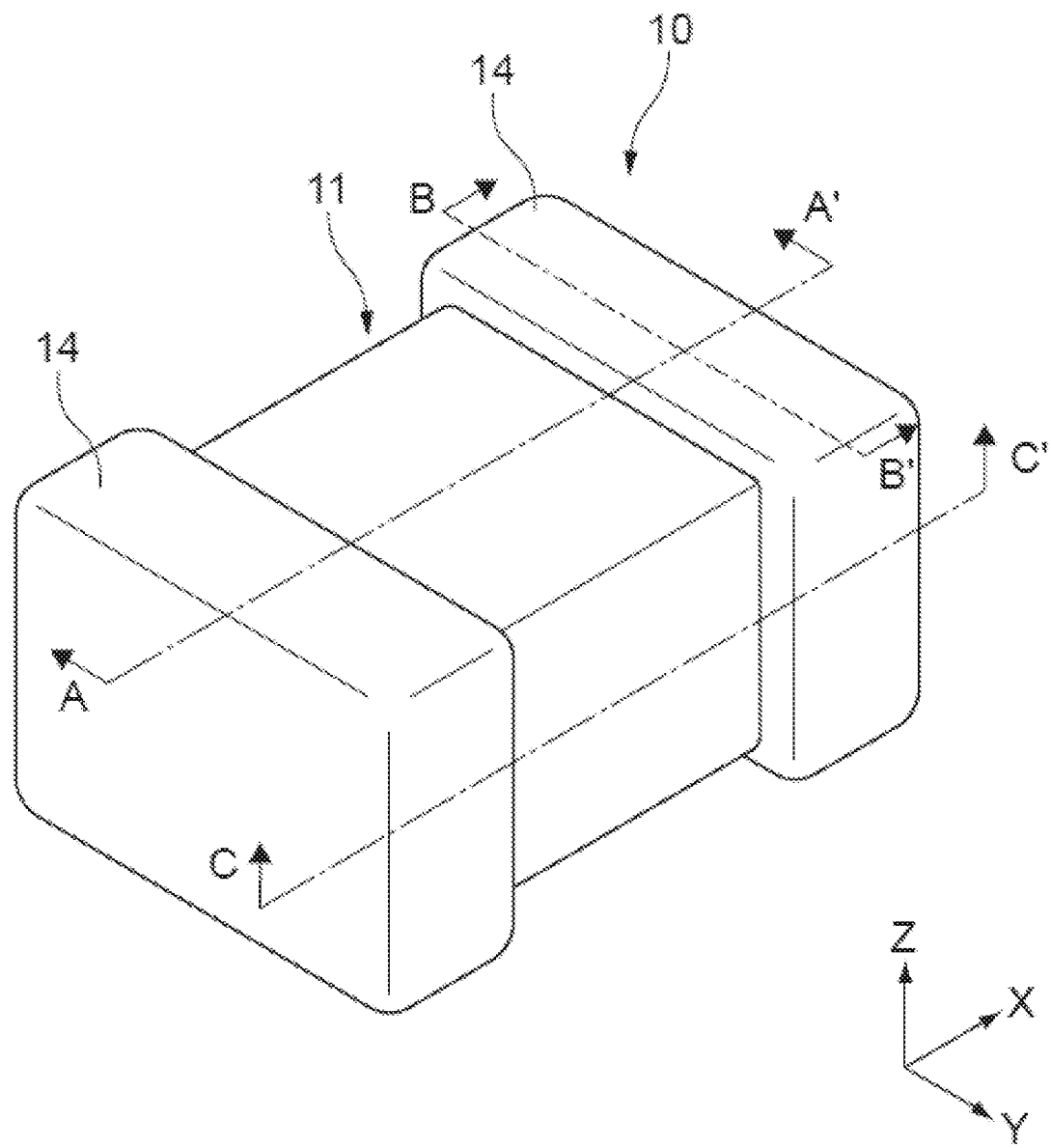
FIG. 1 is a perspective view of a multilayer ceramic capacitor device according to an embodiment of the present disclosure.

Below, embodiments of the present invention will be described with reference to the drawings. In the drawings, the X-axis, the Y-axis and the Z-axis are shown when appropriate. These axes are oriented in the same way for the illustrated devices in all of the drawings.

1. Overall Structure of a Multilayer Ceramic Capacitor 10

Figure 2:
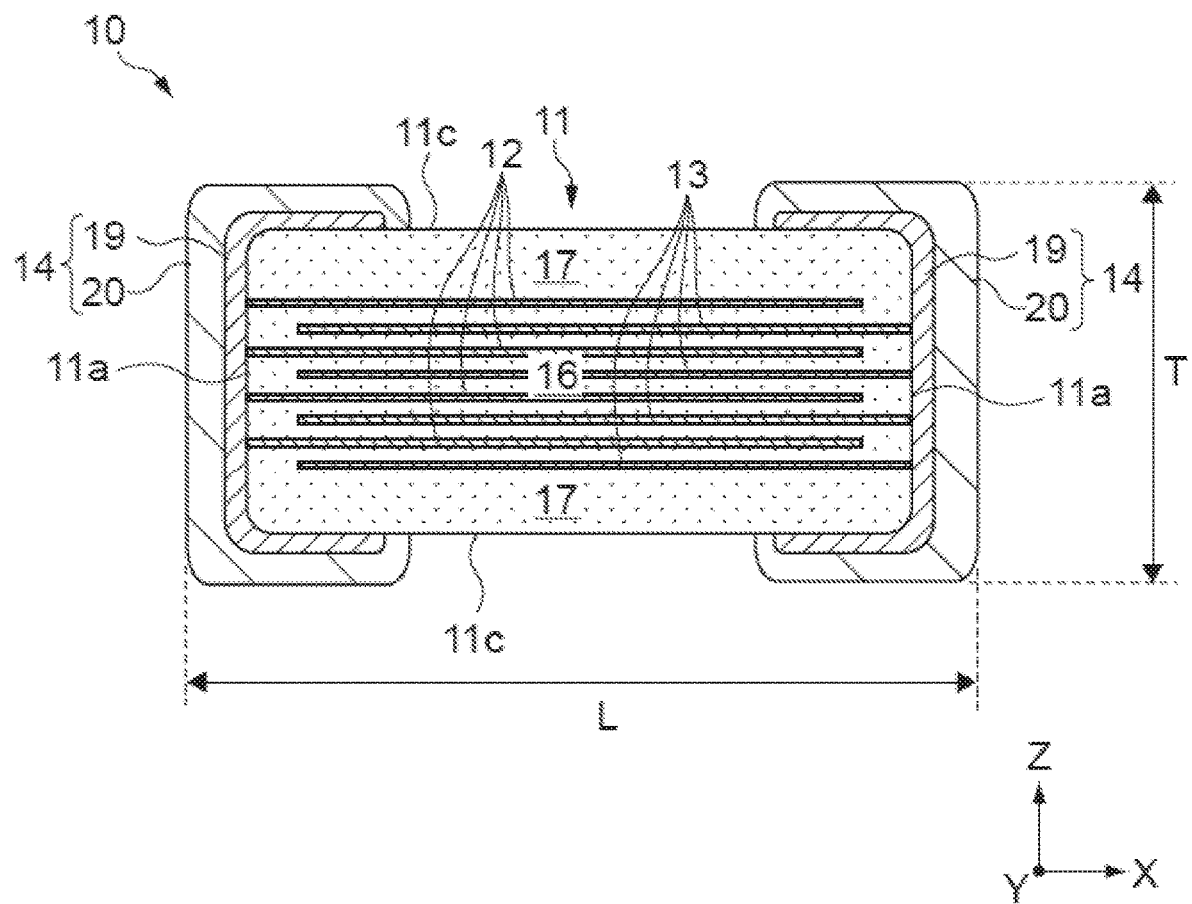
FIG. 2 is a cross-sectional view of the above-described multilayer ceramic capacitor taken along A-A' of FIG. 1.
Figure 3:
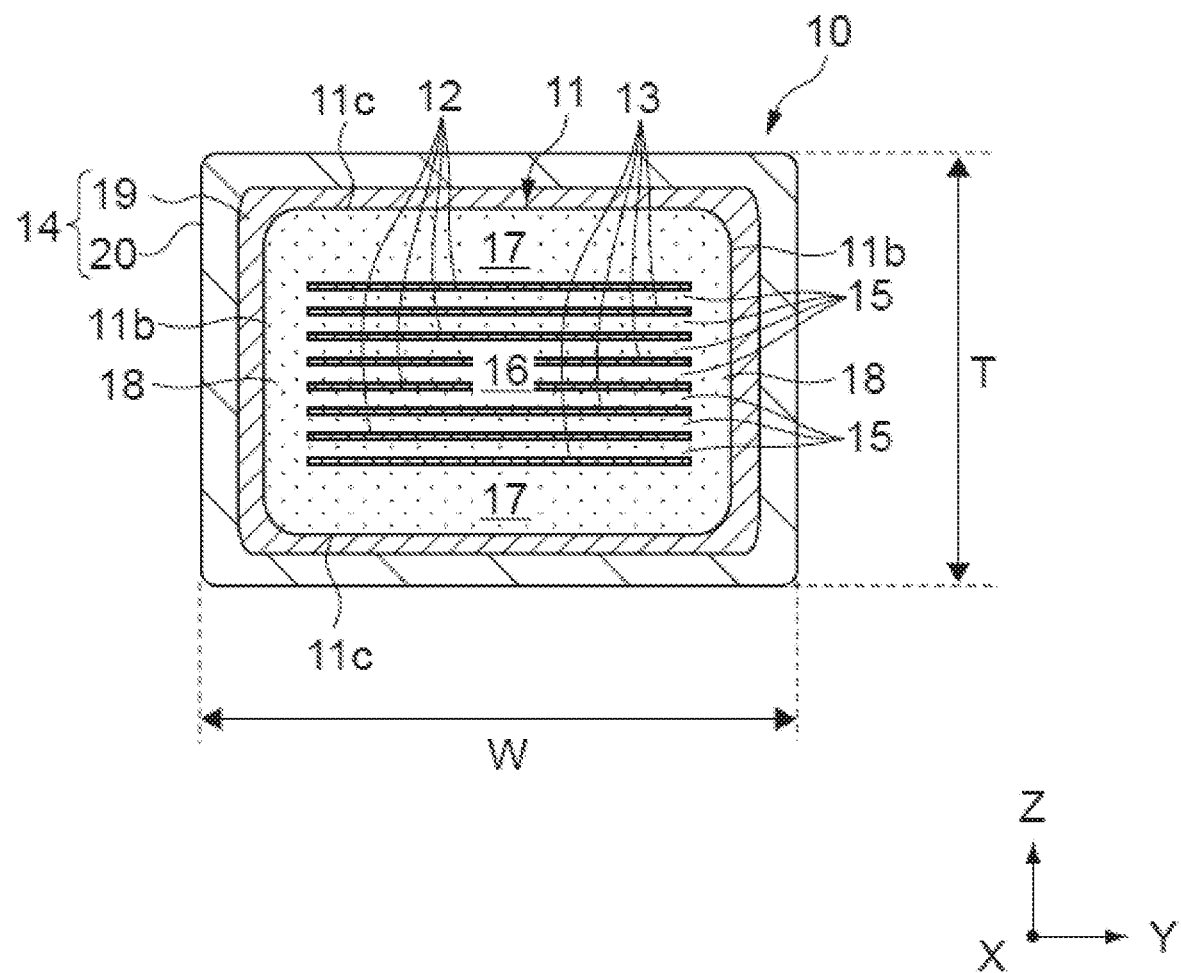
FIG. 3 is a cross-sectional view of the above-described multilayer ceramic capacitor taken along B-B' of FIG. 1.

FIGS. 1-3 shows a multilayer ceramic capacitor 10 according to an embodiment of the present disclosure. FIG. 1 is a perspective view of the multilayer ceramic capacitor 10. FIG. 2 is a cross-sectional view of the above-described multilayer ceramic capacitor taken along A-A' of FIG. 1. FIG. 3 is a cross-sectional view of the above-described multilayer ceramic capacitor taken along B-B' of FIG. 1.

The multilayer ceramic capacitor 10 includes a ceramic main body 11 and two external electrodes 14. The external electrodes are formed on surfaces of the ceramic main body 11.

The ceramic main body 11 has a generally rectangular parallelepiped shape having top and bottom surfaces 11c (also referred to as "main surfaces") opposite to each other in the Z-axis direction, right and left side surfaces 11b opposite to each other in a widthwise direction, which is the Y-axis direction, and end surfaces 11a opposite to each other in a lengthwise direction, which is the X-axis direction. The ceramic main body 11 does not have to be of the shape of precise rectangular parallelepiped, and may have chamfered ridges and corners, for example.

In this embodiment, the height T of the multilayer ceramic electronic device that includes the pair of eternal electrodes is greater than 0.80 times and less than 1.25 times as much as the lessor of the width dimension W of the multilayer ceramic electronic device, as measured in the widthwise direction (Y-axis direction), and the length dimension L of the multilayer ceramic electronic device, as measured in the lengthwise direction (X-axis direction). For example, the dimension L along the X-axis direction is less than 0.7 mm; the dimension W along the Y-axis direction is less than 0.4 mm; and the dimension T along the Z-axis direction is less than 0.4 mm. Here, the dimensions of the multilayer ceramic capacitor 10 are defined as dimensions of the largest parts of the capacitor 10 along the respective dimensions.

Examples of specific dimensions of the multilayer ceramic capacitor 10 includes, but are not limited to: L=0.6 mm and W=T=0.3 mm; L=0.4 mm and W=T=0.2 mm; L=0.25 mm and W=T=0.125 mm; and L=0.2 mm and W=T=0.1 mm.

The ceramic main body 11 includes a capacitance formation part 16, cover parts 17, and side margin parts 18. The capacitance formation part 16 is positioned at center sections of the ceramic main body 11 along the Y-axis direction and Z-axis direction. The cover parts 17 cover the capacitance formation part 16 from above and below along the Z-axis. The side margin parts 18 covers the capacitance formation part 16 from right and left along the Y-axis. The cover parts 17 and the side margin parts 18 protect the capacitance formation part 16 and ensure electrical insulation in the periphery of the capacitance formation region 16.

In the capacitance formation part 16, a plurality of first internal electrodes 12 and a plurality of second internal electrodes 13 are laminated in the Z-axis direction with ceramic layers 15 interposed therebetween. See FIGS. 3 and 4.

Figure 4:
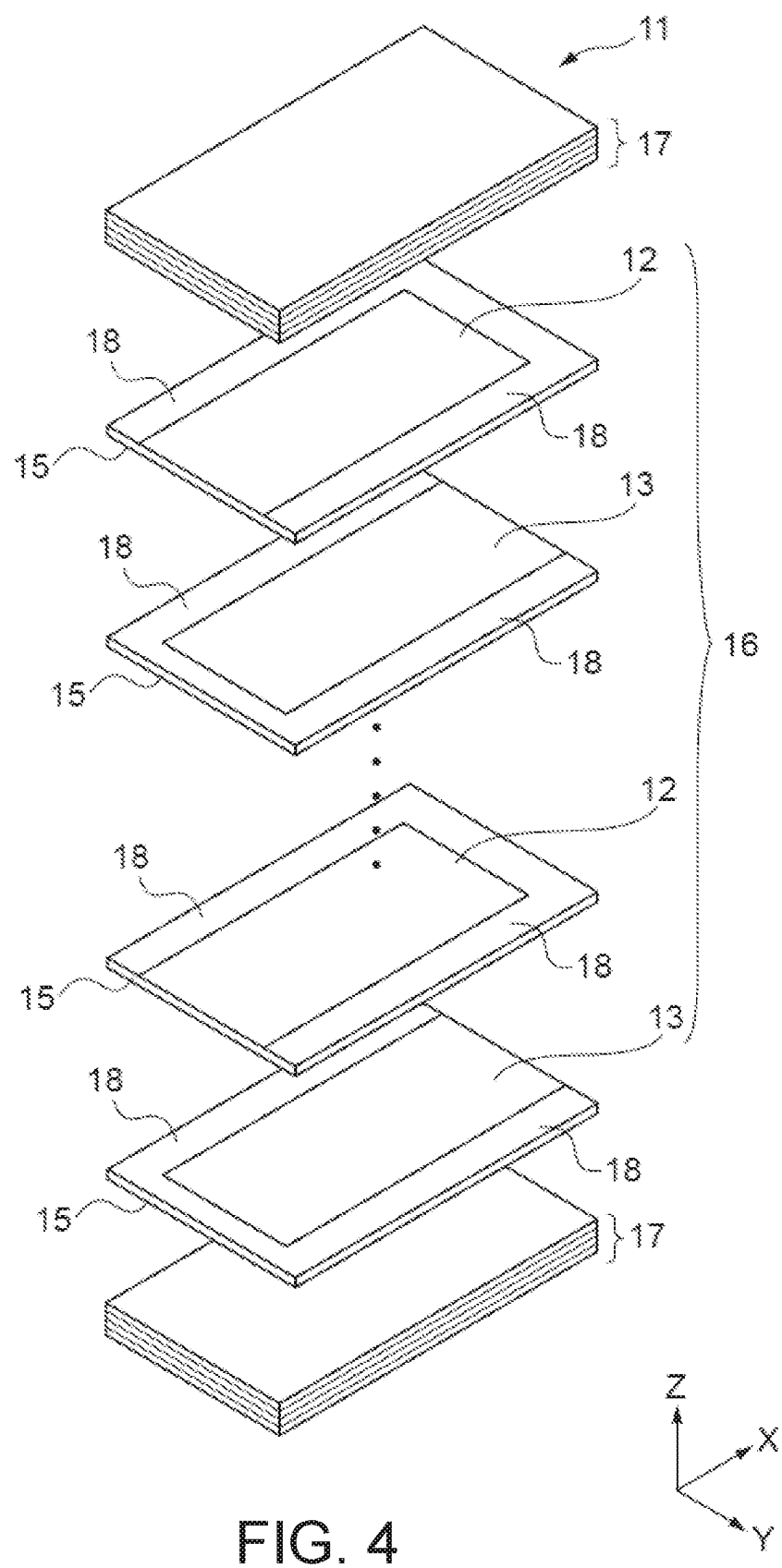
FIG. 4 is an exploded perspective view of a ceramic main body of the above-described multilayer ceramic capacitor.

FIG. 4 is an exploded perspective view of the ceramic main body 11. Although a completed ceramic main body 11 cannot be disassembled this way, this exploded view of FIG. 4 is provided for illustration purposes.

The ceramic main body 11 has a structure in which sheets are laminated as shown in FIG. 4. The capacitance formation part 16 and side margin parts 18 are constructed of sheets having internal electrodes 12, 13 printed thereon. The cover parts 17 are formed of sheets that do not have internal electrodes 12, 13 printed thereon. The internal electrodes 12,13 each have a shape of sheet extending in the X-Y plane, and are laminated alternately in the Z-axis direction.

The internal electrodes 12, 13 are formed of a high electrical conductivity material and function as the internal electrodes of the multilayer ceramic capacitor 10. The high electrical conductivity material that forms the internal electrodes 12, 13 may be metal or alloy having nickel (Ni), copper (Cu), palladium (Pd), platinum (Pt), silver (Ag), of gold (Au) as the main material, for example.

As shown in FIG. 2, the first internal electrodes 12 are drawn to one of end surfaces 11a of the ceramic main body 11, and are connected to one of the external electrodes 14.

Likewise, the second internal electrodes 13 are drawn to the other of end surfaces 11a of the ceramic main body 11, and are connected to the other of the external electrodes 14. Because of this, the internal electrodes 12 and 13 are electrically connected to different external electrodes 14, respectively.

The ceramic layers 15 are made of ceramic dielectric. For the multilayer ceramic capacitor 10, in order to increase the capacitance formed by the internal electrodes 12 and 13 and the corresponding ceramic layers 15, a ceramic dielectric material having a high permittivity is used. Such a ceramic dielectric material having a high permittivity may be a perovskite material that includes barium (Ba) and titanium (Ti), exemplified by barium titanate ($BaTiO_3$).

Other than the barium titanium oxide system materials, the following materials may be used instead: the strontium titanate ($SrTiO_3$) system; the calcium titanate ($CaTiO_3$) system; the magnesium titanate ($MgTiO_3$) system; the calcium zirconate ($CaZrO_3$) system; the calcium titanate zirconate ($Ca(Zr, Ti)O_3$) system; the barium zirconate ($BaZrO_3$) system; and the titanium dioxide ($TiO_2$) system.

The cover parts 17 and the side margin parts 18 are also made of ceramic dielectric materials. It is sufficient that the material for the cover parts 17 and the side margin parts 18 is an insulating ceramic, but by using a similar material system to the material for the capacitance formation part 16, the manufacturing efficiency increases and internal stress in the ceramic main body 11 can be suppressed.

With the above-described structure, when a voltage is applied between the external electrodes 14 of the multilayer ceramic capacitor 10, the voltage is applied to a plurality of insulating ceramic layers 15 sandwiched by the internal electrodes 12, 13. Because of this, the multilayer ceramic capacitor 10 stores charges in accordance with the applied voltage between the external electrodes 14.

2. Structure of External Electrodes 14

As shown in FIGS. 1-3, each of the external electrodes 14 covers the end surface 11a and extends over portions of the main surfaces (top and bottom surfaces) 11c and portions of side surfaces 11b. Each of the external electrodes 14 includes an undercoat film 19 and a plating film 20 formed on the undercoat film.

The undercoat film 19 covers the entirety of the end surface 11a, and portions of the main surfaces 11c and portions of side surfaces 11b, and functions as an undercoat for the plating film 20. The undercoat film 19 is made of a sintered metal film, for example. Specifically, the undercoat film 19 is formed by coating a conductive paste using a dip method or printing method, and by baking the coated conductive paste. The undercoat film 19 includes, for example, nickel (Ni), copper (Cu), palladium (Pd), platinum (Pt), silver (Ag), or gold (Au), as the main component.

Figure 5:
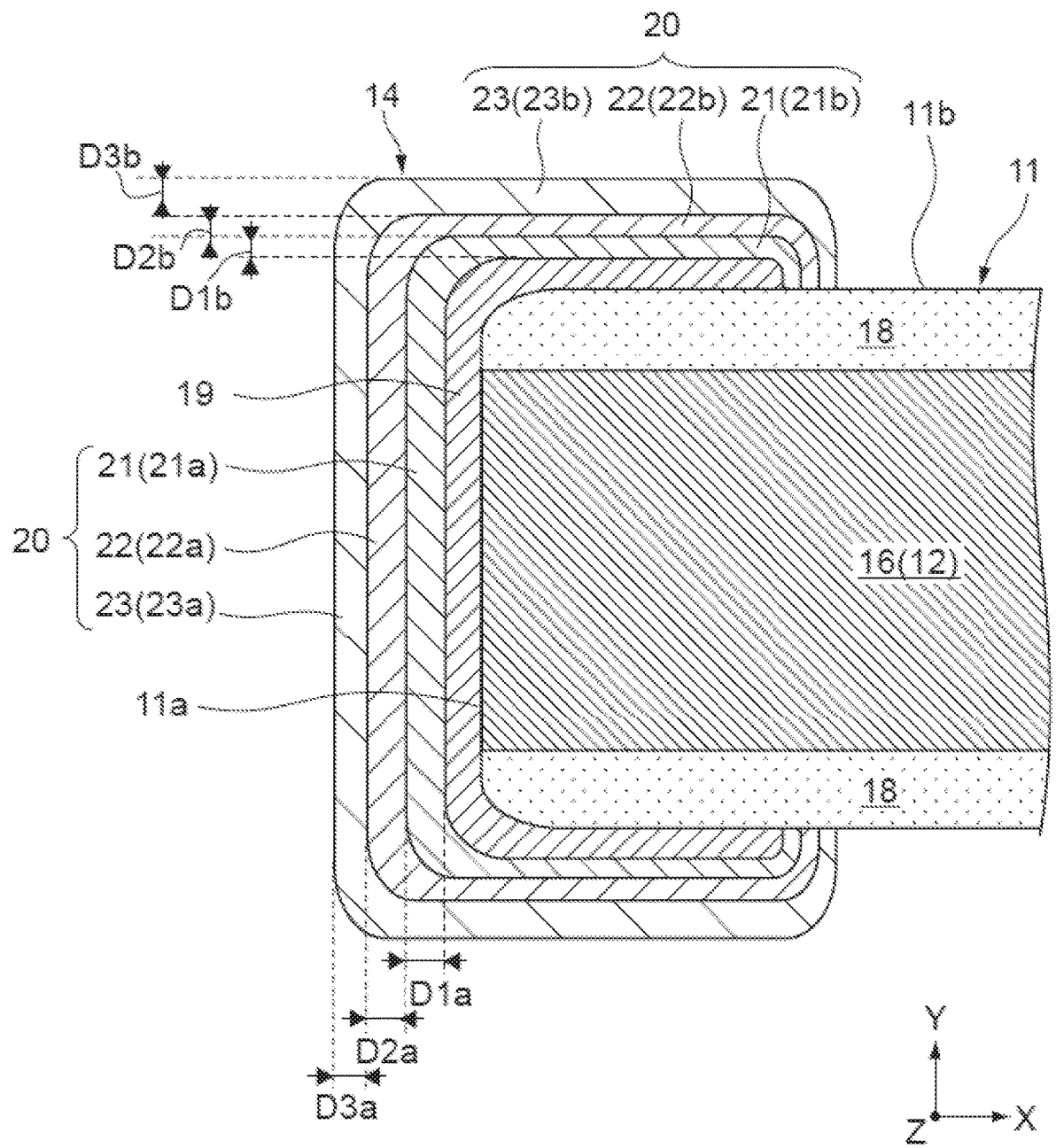
FIG. 5 is a cross-sectional view of the above-described multilayer ceramic capacitor taken along C-C' of FIG. 1, magnifying one of the external electrodes and its vicinity.
Figure 6:
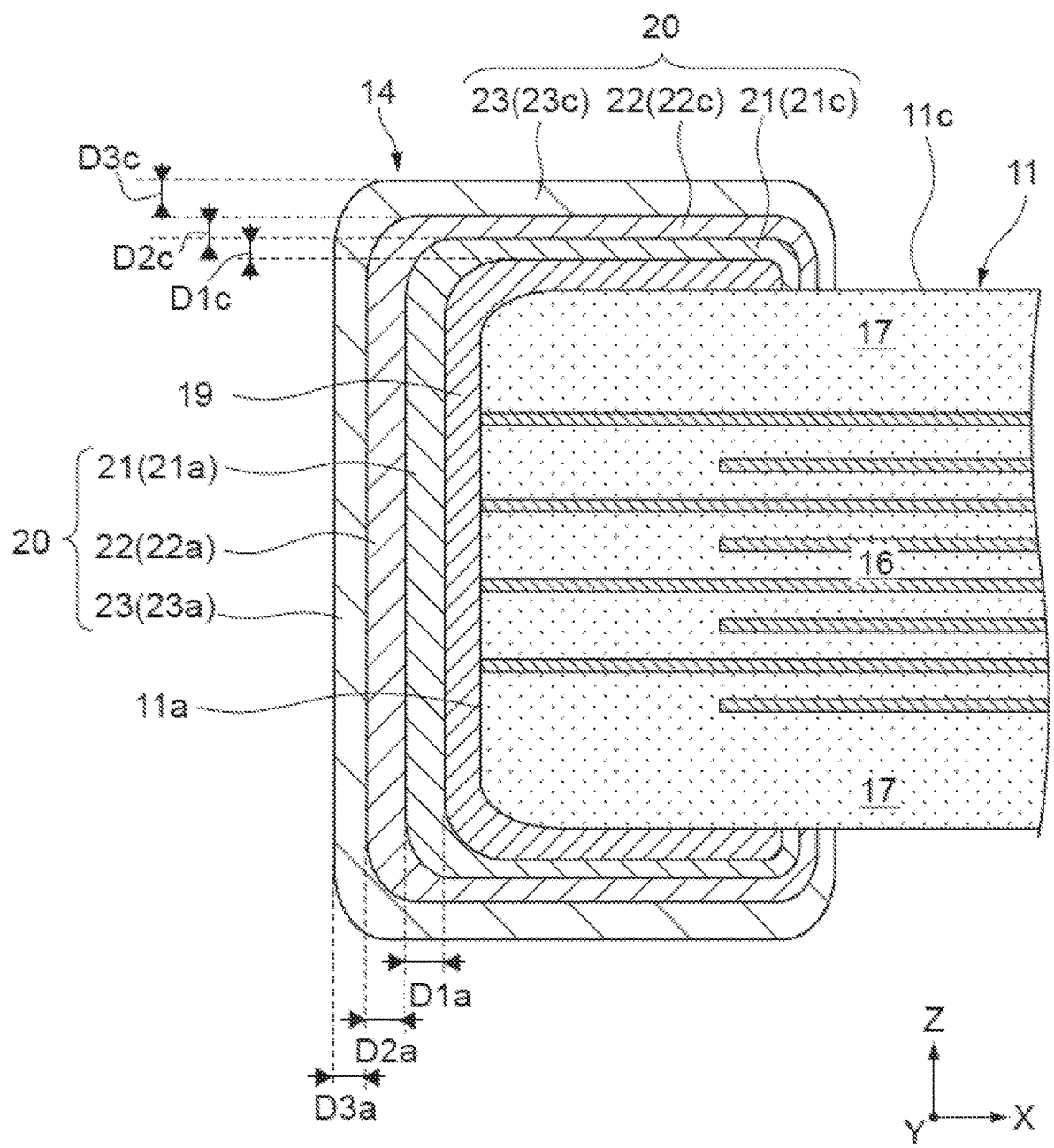
FIG. 6 is a magnified view of one of the external electrodes and its vicinity of FIG. 2

FIG. 5 is a cross-sectional view taken along C-C' of FIG. 1 and is a magnified view magnifying a section adjacent to one of the external electrodes 14. FIG. 6 is a magnified view magnifying a section adjacent to one of the external electrodes 14.

As shown in these drawings, the plating film 20 includes a copper plating film 21 having copper the main material, a nickel plating film 22 having nickel as the main material, and a tin plating film 23 having tin as the main material. That is, the plating film 20 has a three-layered structure.

The copper plating film 21 is formed on the undercoat film 19. The copper plating film 21 helps build high quality consistent plating films on the undercoat film 19. The copper plating film 21 includes a portion 21a on the end surface facing in the negative X-axis direction, portions 21b on the side surfaces respectively facing in the positive and negative directions along the Y-axis, and portions 21c on the top and bottom (main) surfaces respectively facing in the positive and negative directions along the Z-axis.

In the copper plating film 21, the thickness D1a of the portion 21a on the end surface is greater than the thickness D1b of the portions 21b on the side surfaces. For example, D1a is preferably greater than 1.00 times and less than or equal to 1.20 times as much as D1b.

In the copper plating film 21, the thickness D1a of the portion 21a on the end surface may be about the same as the thickness D1c of the portions 21c on the top and bottom surfaces. This helps prevent an unbalance in the solder distribution during mounting. For example, D1c is preferably 0.95 times to 1.05 times as much as D1b.

In this embodiment, the nickel plating film 22 is formed on the copper plating film 21. The nickel plating film 22 helps prevent erosion of the solder into the plating film 20 during mounting. The nickel plating film 22 includes a portion 22a on the end face facing in the negative X-axis direction, portions 22b on the side surfaces respectively facing in the positive and negative directions along the Y-axis, and portions 22c on the top and bottom surfaces respectively facing the positive and negative directions along the Z-axis.

In the nickel plating film 22, the thickness D2a of the portion 22a on the end surface is greater than the thickness D2b of the portions 22b on the side surfaces. For example, in the nickel plating film 22, D2a is preferably greater than 1.00 times and less than or equal to 1.10 times as much as D2b.

In the nickel film 22, the thickness D2b of the portions 22b on the side surfaces may be about the same as the thickness D2c of portions 2c on the top and bottom surfaces. For example, D2c is preferably is greater than 0.95 times and less than or equal to 1.05 times as much as D2b.

The tin plating film 23 is formed on the nickel plating film 22. The tin plating film 23 will melt with the solder during mounting, and improves the wettability of the solder. The tin plating film 23 includes a portion 23a on the end surface facing the negative X-axis direction, portions 23b on the side surfaces respectively facing in the positive and negative directions along the Y-axis, and portions 23c on the top and bottom surfaces respectively facing in the positive and negative directions along the Z-axis.

In the tin plating film 23, the thickness D3a of the portion 23a on the side surface is smaller than the thickness D3b of the portions 23b on the side surfaces. For example, D3a is preferably greater than or equal to 0.90 times and less than or equal to 0.97 times as much as D3b.

In the tin plating film 23, the thickness D3b of the portions 23b on the side surfaces may be about the same as the thickness D3c of portions 23c on the top and bottom surfaces. This will prevent an unbalance in solder distribution during mounting. For example, D3c is preferably greater than or equal to 0.95 times and equal to or less than 1.05 times as much as D3b.

Each of these plating films 21, 22, and 23 can be formed by the barrel electroplating process, for example. In such a case, the thicknesses of respective plating films 21, 22, and 23 are controlled by adjusting the current and/or plating time in the barrel electroplating process. In more detail, the current is controlled to remain at a constant low level and the plating time is adjusted to control the thickness of the respective plating film. This way, the thickness of each of the plating films 21, 22 and 23 is controlled in a stable manner.

In order to provide the above-described thickness difference between the portion 21a on the end surface and portions 21b on the side surfaces in the copper plating film 21, the copper plating is performed as follows. After forming a copper plating film uniformly on the entirety of the undercoat film 19, a plating resist is formed only on the side surfaces 11b and on the top and bottom surfaces 11c, and thereafter, copper plating is additionally performed on the end surface 11a. This way, the portion 21a on the end surface 11a is made thicker than the portions 21b and 21c on the side surfaces and the top and bottom surfaces.

In order to provide the above-described thickness difference between the portion 22a on the end surface and portions 22b on the side surfaces in the nickel plating film 22, the nickel plating is performed as follows. After forming a nickel plating film uniformly on the entirety of the copper plating film 21, a plating resist is formed only on the portions 21b on the side surfaces 11b and on the portions 21c on the top and bottom surfaces 11c, and thereafter, nickel plating is additionally performed on the portion 21a on the end surface 11a. This way, the portion 22a on the end surface is made thicker than the portions 22b and 22c on the side surfaces and the top and bottom surfaces.

In order to provide the above-described thickness difference between the portion 23a on the end surface and portions 23b on the side surfaces in the tin plating film 23, the tin plating is performed as follows. After forming a tin plating film uniformly on the entirety of the nickel plating film 22, a plating resist is formed only on the portions 22a on the end surface 11a, and thereafter, tin plating is additionally performed on the portions 22b and 22c on the side surfaces and on the top and bottom surfaces. This way, the portion 23a on the end surface 11a is made thinner than the portions 23b and 23c on the side surfaces and the top and bottom surfaces.

An exemplary method for forming the above-mentioned plating resist will be explained with reference to schematic figures of FIG. 10. Here, this example forms plating resists for the copper plating film 21. Plating resists for the nickel plating film 22 and the tin plating film 23 can also be formed in the same or similar way. In this example, the plating resist is made of a thermosetting resin that can be cured by heat or an ultraviolet setting resin that can be cured by ultraviolet rays. The viscosity of the plating resist is adjusted in the range from 80 Pa·s to 250 Pa·s, as the case may be.

Figure 10:
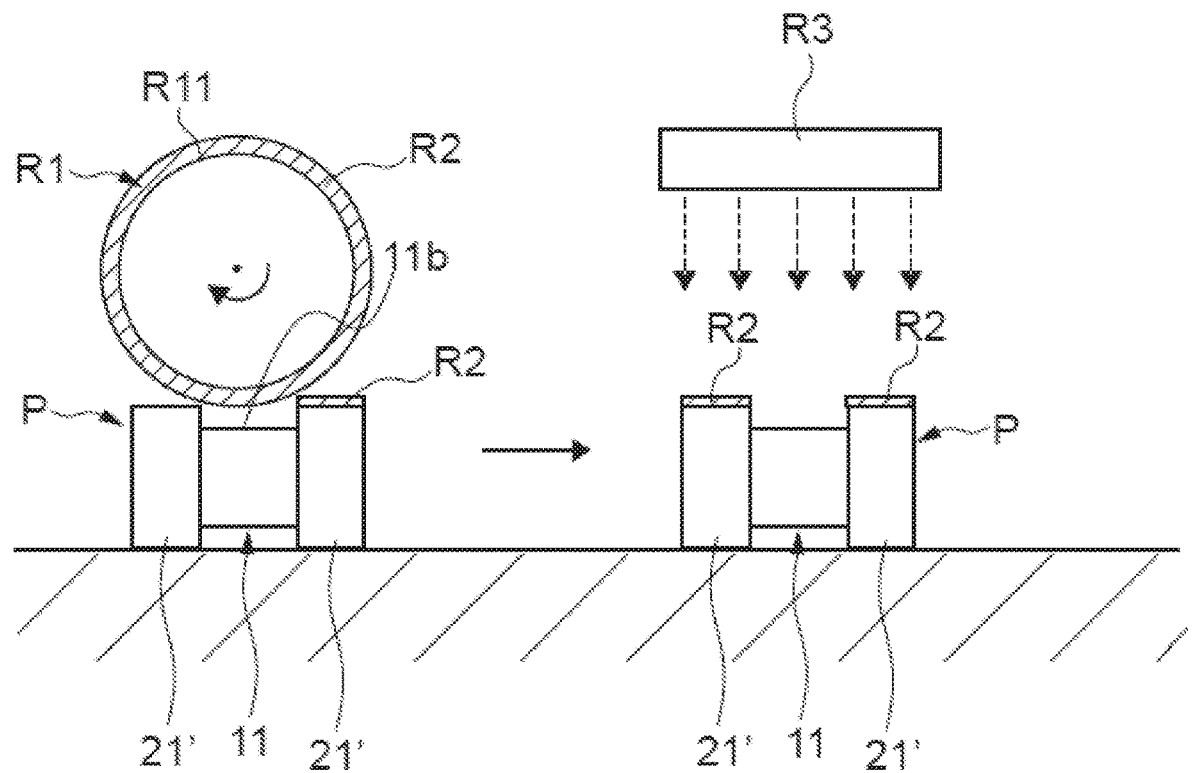
FIG. 10 shows a method of coating a plating resist on a copper plating film as a part of the process of making the external electrode.

First, as shown in FIG. 10, a coating roller R1 having plating resist R2 attached to its circumference R11 is prepared. The object P to be coated having the copper plating film 21' formed on the entire surfaces of the undercoat film 19 is held in such a posture that one of the side surfaces 11b faces the bottom of the circumference R11 of the coating roller R. Portions of the copper plating film 21' on the side surface 11b of the object P are then made in contact with the plating resist R2 of the rotating coating roller R, thereby coating the plating resist R2 on the entire portions of the copper plating film 21' on the side surface 11b. Thereafter, the coated plating resist R2 is hardened by a hardening device R3 which is a heater or an ultraviolet ray source. Then, the posture of the object P is changed such that the main surface 11c faces the bottom of the circumference R11 of the coating roller R, and the plating resist R2 is also formed on portions of the copper plating film 21' on the main surface 11c using the same process. In this plating formation method, by using a jig having a plurality of recesses that respectively house a plurality of objects P to be processed, effective and efficient manufacture is achieved while appropriate postures of the objects P are maintained.

Figure 7A:
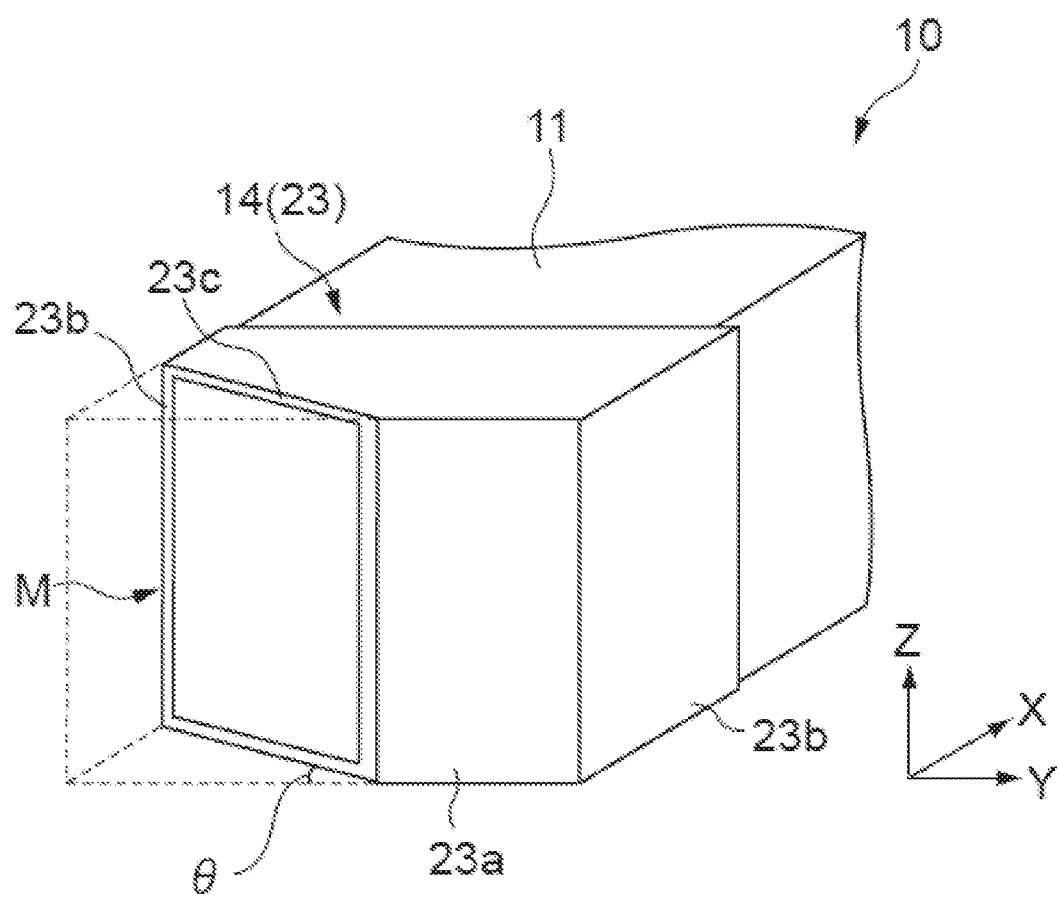
FIGS. 7A-7C are figures explaining a measurement method for thicknesses of plating layers of the above-described multilayer ceramic capacitor.
Figure 7B:
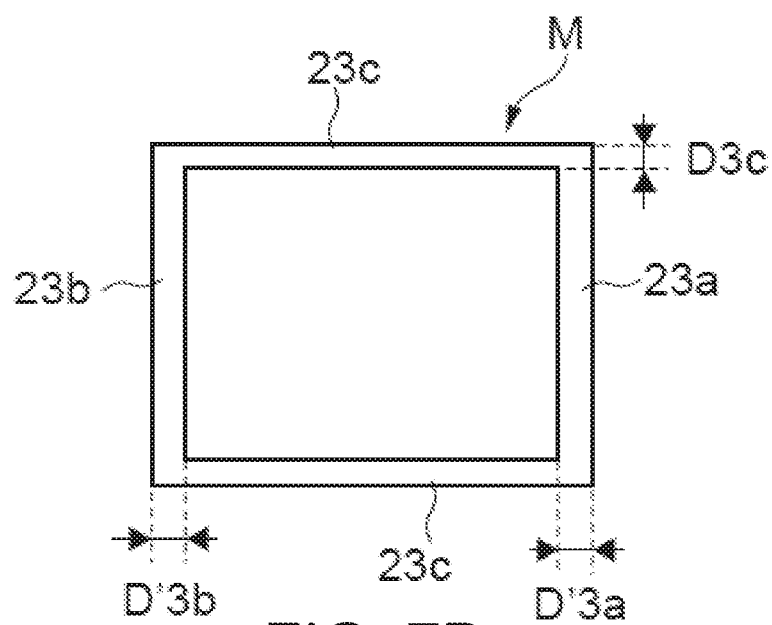
Figure 7C:
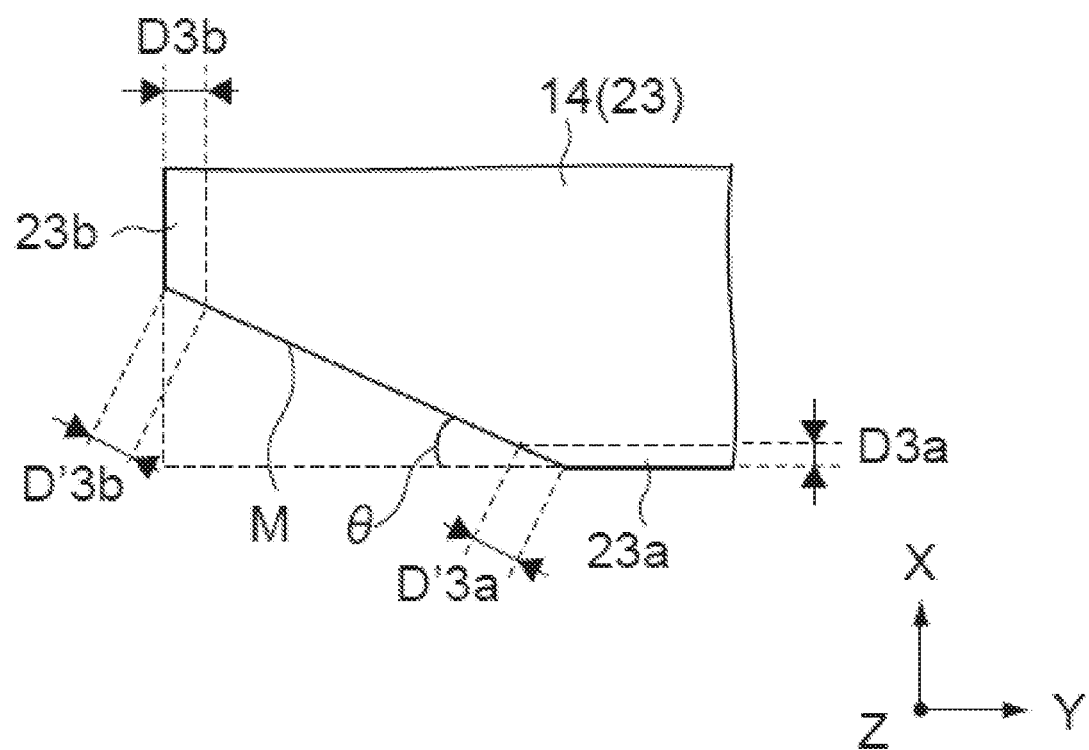

FIGS. 7A-7C are figures explaining a measurement method for the thicknesses of the various plating film in the plating film 20. FIG. 7A is a perspective view of main parts of the multilayer ceramic capacitor 10 that is to be measured. FIG. 7B is a plan view showing the measurement plane M. FIG. 7C is a top view of main parts of the external electrode 14 that is to be measured. In these figures, for ease in illustration, the multilayer ceramic capacitor 10 is schematically depicted to have sharp edges, and the undercoat film 19, the copper plating film 21, and the nickel plating film 22, etc., are omitted. Although a method of measuring the tin plating film 23 is explained below, the copper plating film 21 and nickel plating film 22 can be measured in the same way.

First, by grinding the multilayer ceramic capacitor 10, the measurement plane M is exposed such that the sides along the Z-direction of the measurement plane M are approximately aligned with the center in the X-axis direction and the center in the Y-axis direction of the external electrodes 14, respectively. The measurement plane M makes an acute angle θ with respect to the Y-Z plane, which constitutes a surface of the end surface portion 23a of the tin plating film 23.

Then, the measurement plane M is observed using SEM (Scanning Electron Microscope) to measure the thicknesses of roughly equally divided 5 locations near the center (80% of the entire length of the corresponding cross section) of each of the cross-sectional portion 23a on the end surface, portion 23b on the side surface, and portions 23c on the main surface. Then the average of the 5 measured points is taken for each portion. The magnification is 6000 times, for example.

As shown in FIG. 7B, the average thickness so obtained for the portion 23a on the end surface is regarded as the measured thickness D'3a for 23a. The average thickness so obtained for the portion 23b on the side surface is regarded as the measured thickness D'3b for 23b. The average thickness so obtained for the portion 23c on the main surface is regarded as the measured thickness D3c for 23c. For the portions 23a and 23b, the measured thicknesses D'3a and D'3b must be corrected to obtain the actual thicknesses D3a and D3b in the following manner.

As described above, the measurement plane M is inclined by the angle θ relative to the Y-Z plane. Because of this, the measured thickness D'3a obtained from the portion 23a on the measurement plane M is 1/sin θ times the thickness D3a, as shown in FIG. 7C. Therefore, the actual thickness D3a of the portion 23a on the end surface can be calculated as a value obtained by multiplying the measured thickness D'3a by sin θ, which is (D'3a×sin θ).

Similarly, as shown in FIG. 7C, the measured thickness D'3b obtained from the portion 23b on the measurement plane M is 1/cos θ times the thickness D3b. Therefore, the actual thickness D3b of the portion 23b on the side surface can be calculated as a value obtained by multiplying the measured thickness D'3b by cos θ, which is (D'3b×cos θ).

Here, the measured thickness obtained from the portion 23c on the measurement plane M is the same as the actual thickness D3c of the portion 23c on the main surface. Therefore, no correction is needed.

With the above-described measurement method, the thicknesses of all of the portions of the respective plating films 21, 22, and 23 can be obtained from one measurement plane M. This improve measurement efficiency.

The above-described multilayer ceramic capacitor 10 can be mounted on a mounting substrate by attaching the plating films 20 to the mounting substrate by solder.

3. Structure of the Circuit Board 100

Figure 8:
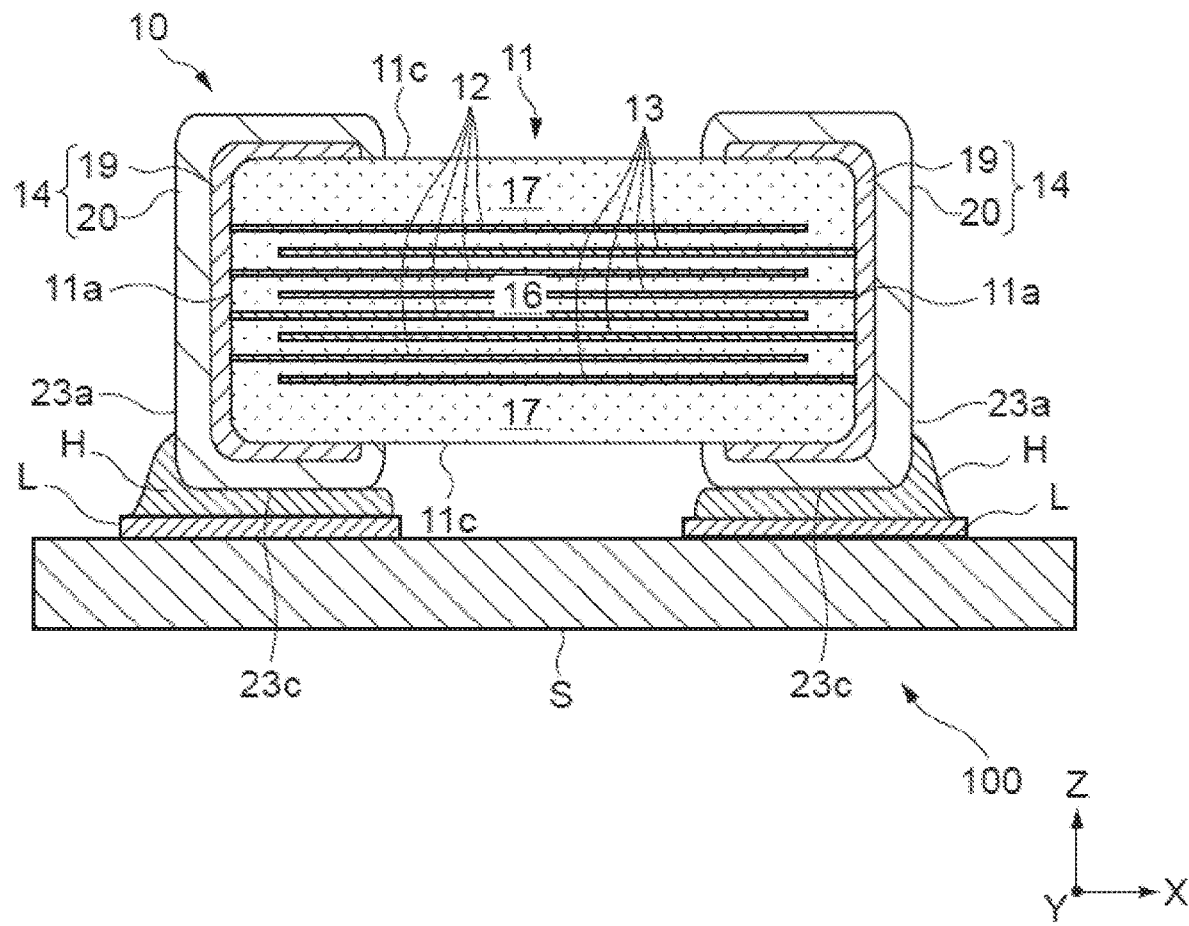
FIG. 8 shows a circuit board on which the above-described multilayer ceramic capacitor is mounted and is a cross-sectional view corresponding to FIG. 2.
Figure 9:
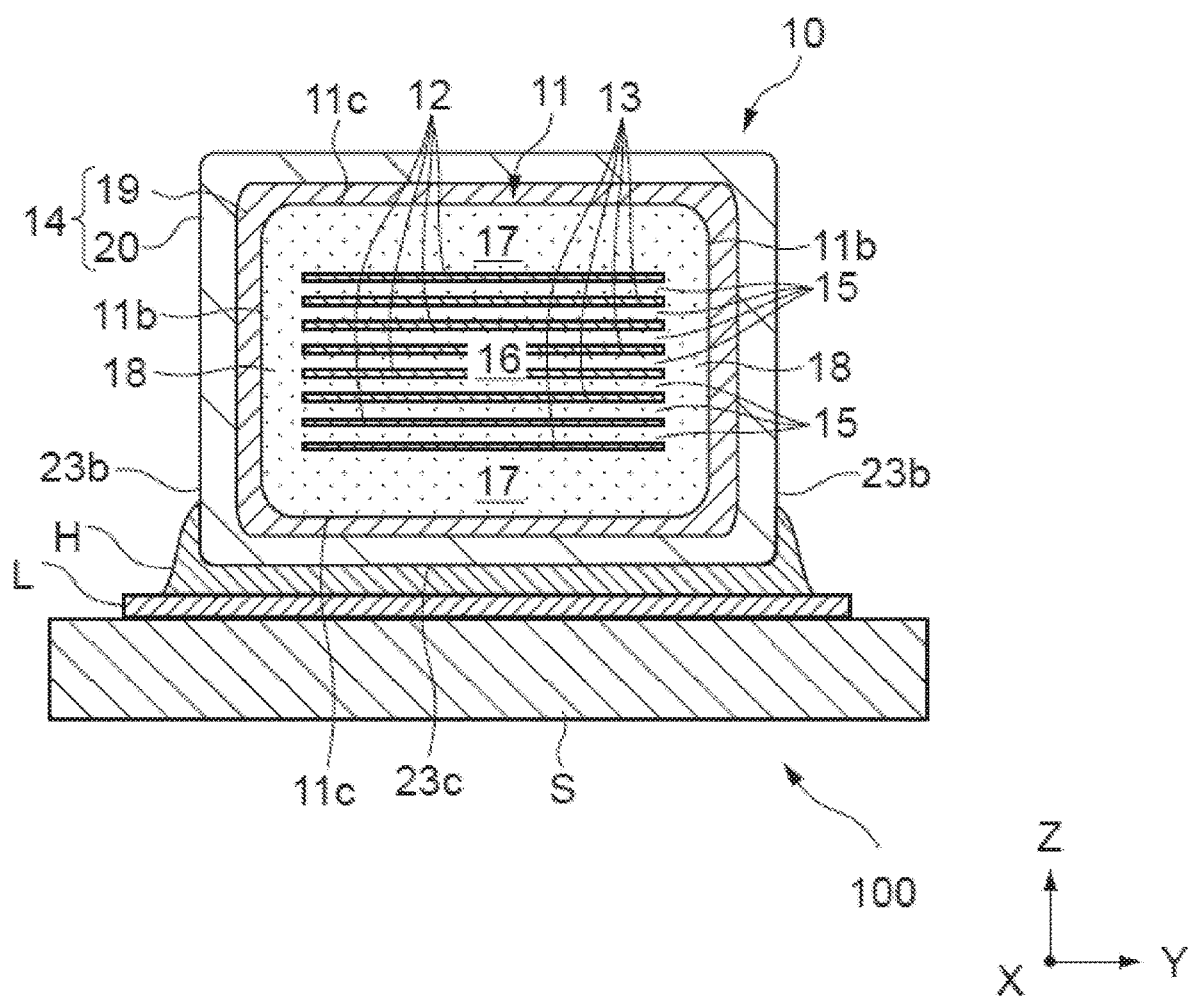
FIG. 9 is the circuit board on which the above-described multilayer ceramic capacitor is mounted and is a cross-sectional view corresponding to FIG. 3.

FIGS. 8 and 9 show a circuit board 100 according to an embodiment of the present disclosure. FIG. 8 is a cross-sectional view corresponding to FIG. 2. FIG. 9 is a cross-sectional view corresponding to FIG. 3.

The circuit board 100 includes the mounting substrate S, a multilayer ceramic capacitor 10, and solders H that connect the plating films 20 of the multilayer ceramic capacitor 10 to the mounting substrate S.

The mounting substrate S is a substrate having circuits formed thereon and has lands L for mounting the multilayer ceramic capacitor 10.

The multilayer ceramic capacitor 10 is mounted on the mounting substrate S such that the main (bottom) surface 11c faces the mounting substrate S. Specifically, the portions 23c of the tin plating films 23 face the corresponding lands L of the mounting substrate S in the negative Z-axis direction. Although FIGS. 8 and 9 do not indicate the copper plating films 21, the nickel plating films 22 and the tin plating films 23 separately, in actuality, as described above, the plating films 20 each have copper plating firm 21, the nickel plating film 22, and the tin plating film 23, as shown in FIGS. 5 and 6.

Each of the solders H connects the plating film 20 of the corresponding external electrode 14 to the corresponding land L. The solder H is formed so as to extend from the portion 23c on the bottom surface to a part of the portion 23a on the end surface and to parts of the portion 23b on the side surfaces.

The circuit board 100 is manufactured in the following way, for example. First, each land L on the mounting substrate S is coated with a solder paste, and the multilayer ceramic capacitor 10 is positioned on the solder pastes. This way, the portions 23c of the tin plating film 23 on the bottom surface are made to be in contact with the respective solder pastes. Then, the entire device is heated in a reflow furnace, thereby causing the solder pastes to melt.

The melted solder pastes cause the multilayer ceramic capacitor 10 to sink in towards the mounting substrate S. As a result, the solder pastes respectively rise from the portions 23c on the bottom surface towards the portions 23a on the end surfaces and the portions 23b on the side surfaces due to wetting. Thereafter, the solder paste is cooled down and solidified, and the solders H that connect the external electrodes 14 and the mounting substrate S together is formed, thereby producing the circuit board 100, as shown in FIGS. 8 and 9.

The multilayer ceramic capacitor 10 of the present embodiment has the following advantages/efficacies when mounted on the mounting substrate S by solders H.

4. Efficacies of the Embodiment

In the tin plating film 23, which constitutes an outermost surface of each plating film 20, the portions 23b on the side surfaces is thicker than the portion 23a on the end surface. Because of this, the reactivity with the solder H is improved at the portions 23b on the side surfaces and the rising of the solder along the portion 23b on the side surfaces due to wetting are promoted.

In the conventional technology, when a multilayer ceramic capacitor is mounted on a mounting substrate, if the multilayer ceramic capacitor is arranged in a biased manner towards one of the lands, the solder tends to rise faster along one of the end surfaces than on the other one of the end surfaces. Because of this, the surface tension due to the solder on the one of the end surfaces becomes strong and that end surface is strongly pulled downwardly along the Z-axis. When this occurs, the multilayer ceramic capacitor receives the rotational moment that causes rotation along the Y-axis, and the other one of the end surface is lifted upwardly along the Z-axis substrate (see paragraph [0009] and FIG. 3 of Patent Document 1).

In contrast, in the present embodiment, because the rising of the tin plating film 23 along the side surfaces due to wetting is promoted, even if the multilayer ceramic capacitor 10 is arranged in a biased manner towards one of the lands L, the rising of the tin plating film 23 along the end surface due to wetting is adequately suppressed. Because of this, the above-described undesired phenomena is prevented, thereby both external electrodes 14 being adequately connected to the corresponding lands L. This improves the connection reliability between the external electrodes 14 and the mounting substrate S.

Furthermore, in the present embodiment, for the nickel plating film 22 and the copper plating film 21, the thicknesses of the portions 22a and 21a on the end surface are respectively made greater than the thicknesses of the portions 22b and 21b on the side surfaces. Because of this, the thermal conductivity and the thermal capacity of the portions 21a and 22a on the end surface are enhanced, and the solder H is easily melted on the portions 21a and 22a. Thus, the solder H can rise due to wetting in a balanced and stable manner.

Further, as will be described with reference to working examples below, for each of the plating films 21, 22, and 23, the thickness of the portion on the end surfaces (21a, 22a, 23a) relative to the thickness of the portion on the side surfaces (21b, 22b, 23b) may be set to be within prescribed specific values ranges. This way, the above-described efficacies can be more securely realized.

As working examples, many samples of the multilayer ceramic capacitor 10 were manufactured as follows. First, ceramic green sheets were formed using a ferroelectric material such as $BaTiO_3$. Internal electrode patterns are then formed on select ones of the ceramic green sheets by a printing method or the like. A prescribed number of the ceramic green sheets having the internal electrode patterns and the ceramic green sheets without the internal electrode patterns are laminated to form a mother laminated body. The mother laminated body was pressed and cut at prescribed lines to create ceramic main bodies each having a laminated structure as shown in FIG. 4, which was yet to be fired.

Using a dipping method, the laminated structure that was yet to be fired was coated with a conductive paste that has nickel as the main component. Here, by immersing the end surface and portions of the top and bottom surfaces and portions of side surfaces of the laminated structure in a dipping bath, the conductive paste was uniformly coated on the end surface and the respective portions of the top and bottom surfaces and the side surfaces. In the same way, the conductive paste was applied to the other end. The resulting laminated structure was then fired at 1000° C. to 1400° C., creating a sintered body in which the ceramic main body has sintered metallic film as the undercoat film.

Using an electroplating method, copper plating films, nickel plating films, and tin plaint films were formed using the above-described undercoat film as the undercoat. This way, ten (10) sample types 1-10 of the multilayer ceramic capacitor 10 were manufactured. Table 1 shows the length L, the width W and the height T of each sample.

TABLE 1

|  |  | Sample 1 | Sample 2 | Sample 3 | Sample 4 | Sample 5 |
|---|---|---|---|---|---|---|
| Device Dimensions (mm) | Length L | 0.4 ± 0.02 | 0.4 ± 0.02 | 0.4 ± 0.02 | 0.4 ± 0.02 | 0.4 ± 0.02 |
|  | Width W | 0.2 ± 0.02 | 0.2 ± 0.02 | 0.2 ± 0.02 | 0.2 ± 0.02 | 0.2 ± 0.02 |
|  | Height T | 0.22 Max | 0.2 ± 0.02 | 0.2 ± 0.02 | 0.2 ± 0.02 | 0.2 ± 0.02 |
| Thickness on the side surface (μm) | Cu plating | 4.32 | 3.66 | 3.73 | 3.98 | 3.88 |
|  | Ni plating | 2.02 | 2.31 | 2.25 | 2.12 | 2.16 |
|  | Sn Plating | 5.19 | 4.70 | 4.33 | 4.44 | 4.41 |
|  | Plating total | 11.53 | 10.66 | 10.31 | 10.54 | 10.45 |
| Thickness on the end surface (μm) | Cu plating | 4.49 | 3.95 | 4.36 | 4.49 | 4.30 |
|  | Ni plating | 2.20 | 2.36 | 2.43 | 2.29 | 2.29 |
|  | Sn Plating | 4.87 | 4.55 | 4.02 | 4.10 | 4.19 |
|  | Plating total | 11.57 | 10.87 | 10.81 | 10.88 | 10.77 |
| Thickness Ratio = (Thickness on the end surface)/ (thickness on the side surface) | Cu plating | 1.04 | 1.08 | 1.17 | 1.13 | 1.11 |
|  | Ni plating | 1.09 | 1.02 | 1.08 | 1.08 | 1.06 |
|  | Sn Plating | 0.94 | 0.97 | 0.93 | 0.92 | 0.95 |
|  | Plating total | 1.00 | 1.02 | 1.05 | 1.03 | 1.03 |

|  |  | Sample 6 | Sample 7 | Sample 8 | Sample 9 | Sample 10 |
|---|---|---|---|---|---|---|
| Device Dimensions (mm) | Length L | 0.4 ± 0.02 | 0.4 ± 0.02 | 0.6 ± 0.05 | 0.6 ± 0.05 | 0.6 ± 0.05 |
|  | Width W | 0.2 ± 0.02 | 0.2 ± 0.02 | 0.3 ± 0.05 | 0.3 ± 0.05 | 0.3 ± 0.05 |
|  | Height T | 0.2 ± 0.02 | 0.2 ± 0.02 | 0.3 ± 0.05 | 0.3 ± 0.05 | 0.3 ± 0.05 |
| Thickness on the side surface (μm) | Cu plating | 4.10 | 4.00 | 4.23 | 4.24 | 3.26 |
|  | Ni plating | 2.17 | 2.15 | 2.09 | 2.09 | 2.13 |
|  | Sn Plating | 4.59 | 4.57 | 5.21 | 5.08 | 4.65 |
|  | Plating total | 10.86 | 10.72 | 11.54 | 11.41 | 10.05 |
| Thickness on the end surface (μm) | Cu plating | 4.56 | 4.10 | 4.68 | 4.86 | 3.53 |
|  | Ni plating | 2.31 | 2.15 | 2.17 | 2.13 | 2.15 |
|  | Sn Plating | 4.37 | 4.15 | 4.96 | 4.66 | 4.39 |
|  | Plating total | 11.24 | 10.39 | 11.81 | 11.64 | 10.07 |
| Thickness Ratio = (Thickness on the end surface)/ | Cu plating | 1.11 | 1.02 | 1.11 | 1.14 | 1.08 |
|  | Ni plating | 1.06 | 1.00 | 1.04 | 1.02 | 1.01 |
|  | Sn Plating | 0.95 | 0.91 | 0.95 | 0.92 | 0.94 |

TABLE 1-continued

| (thickness on the side surface) | Plating total | 1.03 | 0.97 | 1.02 | 1.02 | 1.00 |

Using the method described with reference to FIGS. 7A-7C above, for each of the samples 1-10, the thickness of each of the portions 21a, 22a, and 23a on the end surface, the thickness of each of the portions 21b, 22b, and 23b on the side surfaces, and the thickness of each of the portions 21c, 22c, and 23c on the main surface are calculated. As described above, these thicknesses are calculated based on 5 measurement points for each of the portions. Table 1 lists the thicknesses that have been calculated that way. Table 1 also lists the total thickness of the plating films 21, 22 and 23 for each sample.

As shown in Table 1, for the tin plating film 23 (Sn plating film), the thickness on the end surface (portion 23a) was made smaller than the thickness on the side surfaces (portion 23b). Specifically, the thickness of the portion 23a on the end surface was 0.90 or greater times and 0.97 or less times as much as the thickness of the portion 23b on the side surfaces.

For the nickel plating film 22 (Ni plating film), the thickness on the end surface (portion 22a) was made greater than the thickness on the side surfaces (portion 22b). Specifically, the thickness of the portion 22a on the end surface was greater than 1.00 times and 1.10 or less times as much as the thickness of the portion 22b on the side surfaces.

For the copper plating film 21 (Cu plating film), the thickness on the end surface (portion 21a) was made greater than the thickness on the side surfaces (portion 21b). Specifically, the thickness of the portion 21a on the end surface was greater than 1.00 times and 1.20 or less times as much as the thickness of the portion 21b on the side surfaces.

For each of the samples 1-10, samples that were not used for measuring the plating thicknesses were mounted on a mounting substrate S by solder using the reflow method. The above-described phenomena of one of the end surfaces undesirably rising upwardly was not observed in any of the samples. Further, the solder rose adequately on the end surfaces 11a and side surfaces 11b due to wetting. Therefore, it was confirmed that these working examples indeed were mounted reliably and stably. In more detail, a total of one thousand (1000) samples of the samples 1 to 10 were investigated in this way, and it was found that none of them exhibited the mounting error of one end surface undesirably rising upwardly. For comparison, one thousand (1000) of comparative samples in which the thicknesses of the plating files were outside of the above-described value ranges (specifically, for the tin plating film 23, the thickness of the portion 23a on the end surfaced was 1.02 times as much as the thickness of the portion 23b on the side surfaces) were made and investigated. It was found that 2 of them exhibited the mounting error of one end surface undesirably rising upwardly.

Therefore, it has been confirmed that for those working examples in which, for each of the plating films 21, 22, and 23, the thickness of the portion on the end surface (21a, 22a, 23a) relative to the thickness of the portion on the side surfaces (21b, 22b, 23b) is set within the above-described ranges, the connection strength of the solder H is enhanced and the connection reliability with the external electrodes 14 is improved.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

For example, the plating film 20 does not necessarily have to have the three-layered structure, and may have a two-layered structure of a nickel plating film and a tin plating film, or may be a four or more layered structure, for example. Even in these cases, as long as the outermost tin plating layer has a smaller thickness on the end surface than on the side surfaces, a reasonably good degree of the above-described advantageous effects can be obtained.

Also, the undercoat film 19 is not limited to the sintered metal film. For example, an evaporated film, such as a sputtered film, may be used instead. Alternatively, the undercoat film 19 may include both a sintered metal film and an evaporated film, such as a sputtered film.

In the embodiments described above, the multilayer ceramic capacitors 10 have been described as an example of multilayer ceramic electronic component. Nonetheless, the present disclosure is applicable to multilayer ceramic electronic devices that have the structure of ceramic layers and internal electrodes stacked together in general. Such multilayer ceramic electronic devices are, for example, piezoelectric devices and multilayer ceramic inductors.

What is claimed is:
1. A multilayer ceramic electronic device, comprising:
a ceramic main body having a generally rectangular parallelepiped shape having top and bottom surfaces opposite to each other, right and left side surfaces opposite to each other in a widthwise direction, and end surfaces opposite to each other in a lengthwise direction, the ceramic main body including a plurality of internal electrodes laminated vertically with dielectric ceramic layers interposed therebetween,
a pair of external electrodes respectively covering the end surfaces of the main body, each of the pair of external electrodes being in contact with lateral ends of one or more of the plurality of electrodes that are exposed from one of the end surfaces, each of the pair of external electrodes extending beyond peripheral edges of the corresponding end surface so as to cover portions of the top and bottom surfaces and portions of the side surfaces that are adjacent to and abut the corresponding end surface, each of the pair of external electrodes having an undercoat film disposed on the ceramic main body and a plating film on the undercoat film,
wherein a height of the multilayer ceramic electronic device that includes the pair of external electrodes is greater than 0.80 times and less than 1.25 times as much as the lesser of a width dimension of the multilayer ceramic electronic device, as measured in the widthwise direction, and a length dimension of the multilayer ceramic electronic device, as measured in the lengthwise direction,
wherein in each of the pair of external electrodes, the plating film includes a tin plating film as an outermost layer, and a thickness of the tin plating film on the end surface is smaller than a thickness of the tin plating film on the side surfaces, and wherein the thickness of the tin plating film on the end surface is 0.90 to 0.97 times as much as the thickness of the tin plating film on the side surfaces.

2. The multilayer ceramic electronic device according to claim 1, wherein in each of the pair of external electrodes, the plating film further includes a nickel plating film interposed between the undercoat film and the tin plating film, and a thickness of the nickel plating film on the end surface is greater than a thickness of the nickel plating film on the side surfaces.

3. The multilayer ceramic electronic device according to claim 2, wherein the thickness of the nickel plating film on the end surface is greater than 1.00 times and less than or equal to 1.10 times as much as the thickness of the nickel plating film on the side surfaces.

4. A circuit board, comprising:
a mounting substrate; and
the multilayer ceramic electronic device as set forth in claim 3, mounted on the mounting substrate by soldering,
wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

5. A circuit board, comprising:
a mounting substrate; and
the multilayer ceramic electronic device as set forth in claim 2, mounted on the mounting substrate by soldering,
wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

6. The multilayer ceramic electronic device according to claim 1, wherein in each of the pair of external electrodes, the plating film further includes a copper plating film interposed between the undercoat film and the tin plating film, and a thickness of the copper plating film on the end surface is greater than a thickness of the copper plating film on the side surfaces.

7. The multilayer ceramic electronic device according to claim 6, wherein the thickness of the copper plating film on the end surface is greater than 1.00 times and less than or equal to 1.20 times as much as the thickness of the copper plating film on the side surfaces.

8. A circuit board, comprising:
a mounting substrate; and
the multilayer ceramic electronic device as set forth in claim 7, mounted on the mounting substrate by soldering,
wherein with respect to each of the pair of external electrodes of the multilayer ceramic electronic device,
a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

9. The multilayer ceramic electronic device according to claim 6, wherein the height of the multilayer ceramic electronic device that includes the pair of external electrodes is less than or equal to 0.4 mm, and the greater of the width dimension of the multilayer ceramic electronic device and the length dimension of the multilayer ceramic electronic device is less than or equal to 0.2 mm.

10. A circuit board, comprising:
a mounting substrate; and
the multilayer ceramic electronic device as set forth in claim 9, mounted on the mounting substrate by soldering,
wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

11. A circuit board, comprising:
a mounting substrate; and
the multilayer ceramic electronic device as set forth in claim 6, mounted on the mounting substrate by soldering,
wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

12. The multilayer ceramic electronic device according to claim 1,
wherein in each of the pair of external electrodes, the plating film further includes a copper plating film on the undercoat film and a nickel plating film on the copper plating film under the tin plating film,
wherein a thickness of the nickel plating film on the end surface is greater than a thickness of the nickel plating film on the side surfaces, and a thickness of the copper plating film on the end surface is greater than a thickness of the copper plating film on the side surfaces.

13. The multilayer ceramic electronic device according to claim 12,
wherein the thickness of the tin plating film on the end surface is 0.80 to 0.97 times as much as the thickness of the tin plating film on the side surfaces,
wherein the thickness of the nickel plating film on the end surface is greater than 1.00 times and less than or equal to 1.10 times as much as the thickness of the nickel plating film on the side surfaces, and
wherein the thickness of the copper plating film on the end surface is greater than 1.00 times and less than or equal to 1.20 times as much as the thickness of the copper plating film on the side surfaces.

14. A circuit board, comprising:
a mounting substrate; and
the multilayer ceramic electronic device as set forth in claim 1, mounted on the mounting substrate by soldering;
wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

15. A multilayer ceramic electronic device, comprising:
a ceramic main body having a generally rectangular parallelepiped shape having top and bottom surfaces opposite to each other, right and left side surfaces opposite to each other in a widthwise direction, and end surfaces opposite to each other in a lengthwise direction, the ceramic main body including a plurality of internal electrodes laminated vertically with dielectric ceramic layers interposed therebetween,
a pair of external electrodes respectively covering the end surfaces of the main body, each of the pair of external electrodes being in contact with lateral ends of one or more of the plurality of electrodes that are exposed from one of the end surfaces, each of the pair of external electrodes extending beyond peripheral edges of the corresponding end surface so as to cover portions of the top and bottom surfaces and portions of the side surfaces that are adjacent to and abut the corresponding end surface, each of the pair of external electrodes having an undercoat film disposed on the ceramic main body and a plating film on the undercoat film,
wherein a height of the multilayer ceramic electronic device that includes the pair of external electrodes is greater than 0.80 times and less than 1.25 times as much as the lesser of a width dimension of the multilayer ceramic electronic device, as measured in the widthwise direction, and a length dimension of the multilayer ceramic electronic device, as measured in the lengthwise direction,
wherein in each of the pair of external electrodes, the plating film includes a tin plating film as an outermost layer, and a thickness of the tin plating film on the end surface is smaller than a thickness of the tin plating film on the side surfaces, and
wherein in each of the pair of external electrodes, the plating film further includes a nickel plating film interposed between the undercoat film and the tin plating film, and a thickness of the nickel plating film on the end surface is greater than a thickness of the nickel plating film on the side surfaces.

16. The multilayer ceramic electronic device according to claim 15, wherein the thickness of the nickel plating film on the end surface is greater than 1.00 times and less than or equal to 1.10 times as much as the thickness of the nickel plating film on the side surfaces.

17. A circuit board, comprising:
a mounting substrate; and
the multilayer ceramic electronic device as set forth in claim 16, mounted on the mounting substrate by soldering,
wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

18. A circuit board, comprising:
a mounting substrate; and
the multilayer ceramic electronic device as set forth in claim 15, mounted on the mounting substrate by soldering,
wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

19. A multilayer ceramic electronic device, comprising:
a ceramic main body having a generally rectangular parallelepiped shape having top and bottom surfaces opposite to each other, right and left side surfaces opposite to each other in a widthwise direction, and end surfaces opposite to each other in a lengthwise direction, the ceramic main body including a plurality of internal electrodes laminated vertically with dielectric ceramic layers interposed therebetween,
a pair of external electrodes respectively covering the end surfaces of the main body, each of the pair of external electrodes being in contact with lateral ends of one or more of the plurality of electrodes that are exposed from one of the end surfaces, each of the pair of external electrodes extending beyond peripheral edges of the corresponding end surface so as to cover portions of the top and bottom surfaces and portions of the side surfaces that are adjacent to and abut the corresponding end surface, each of the pair of external electrodes having an undercoat film disposed on the ceramic main body and a plating film on the undercoat film,
wherein a height of the multilayer ceramic electronic device that includes the pair of external electrodes is greater than 0.80 times and less than 1.25 times as much as the lesser of a width dimension of the multilayer ceramic electronic device, as measured in the widthwise direction, and a length dimension of the multilayer ceramic electronic device, as measured in the lengthwise direction,
wherein in each of the pair of external electrodes, the plating film includes a tin plating film as an outermost layer, and a thickness of the tin plating film on the end surface is smaller than a thickness of the tin plating film on the side surfaces, and
wherein in each of the pair of external electrodes, the plating film further includes a copper plating film interposed between the undercoat film and the tin plating film, and a thickness of the copper plating film on the end surface is greater than a thickness of the copper plating film on the side surfaces.

20. The multilayer ceramic electronic device according to claim 19, wherein the thickness of the copper plating film on the end surface is greater than 1.00 times and less than or equal to 1.20 times as much as the thickness of the copper plating film on the side surfaces.

21. A circuit board, comprising:

a mounting substrate; and the multilayer ceramic electronic device as set forth in claim 20, mounted on the mounting substrate by soldering, wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

22. The multilayer ceramic electronic device according to claim 19, wherein the height of the multilayer ceramic electronic device that includes the pair of external electrodes is less than or equal to 0.4 mm, and the greater of the width dimension of the multilayer ceramic electronic device and the length dimension of the multilayer ceramic electronic device is less than or equal to 0.2 mm.

23. A circuit board, comprising:

a mounting substrate; and the multilayer ceramic electronic device as set forth in claim 22, mounted on the mounting substrate by soldering, wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

24. A circuit board, comprising:

a mounting substrate; and the multilayer ceramic electronic device as set forth in claim 19, mounted on the mounting substrate by soldering, wherein with respect to each of the pair of external electrodes of the multilayer ceramic electronic device, a solder is attached to a surface of the mounting substrate and to the plating layer of the external electrode on the bottom surface of the multilayer ceramic electronic device and extends beyond edges of the bottom surface of the multilayer ceramic electronic device so as to partially cover the plating layer of the external electrode on the end surface and on the side surfaces.

* * * * *